United States Patent [19]

Mossberg

[11] Patent Number: 4,459,682

[45] Date of Patent: Jul. 10, 1984

[54] TIME DOMAIN DATA STORAGE

[76] Inventor: Thomas W. Mossberg, 119 Antrim St., Cambridge, Mass. 02139

[21] Appl. No.: 330,495

[22] Filed: Dec. 14, 1981

[51] Int. Cl.³ ............................................. G11C 13/04
[52] U.S. Cl. .................................................. 365/119
[58] Field of Search ................ 365/119, 215, 216, 234

[56] References Cited

U.S. PATENT DOCUMENTS

| 3,896,420 | 7/1975 | Szabo .................................. | 365/119 |
| 4,101,976 | 7/1978 | Castro et al. ......................... | 365/119 |
| 4,158,890 | 6/1979 | Burland ............................... | 365/119 |

OTHER PUBLICATIONS

Fernbach and Proctor, "Spin-Echo Memory Device," Journal of Applied Physics, vol. 26, No. 2, 2/55—pp. 170–181.
Anderson et al., "Spin Echo Serial Storage Memory," Journal of Applied Physics, vol. 26, No. 11, 11/55—pp. 1324–1338.
Zuikov et al., JETP Lett., vol. 32, No. 4, 8/80—pp. 270–274.

Primary Examiner—Joseph A. Popek
Attorney, Agent, or Firm—Martin F. Savitzky

[57] ABSTRACT

A frequency selective optical data computer memory apparatus and method, which stores and accesses time modulated data in discrete spatial locations of an optically absorbing material providing a temporary, permanent and erasable, or permanent and nonerasable data storage.

13 Claims, 4 Drawing Figures

TIME DOMAIN DATA STORAGE

FIELD OF THE INVENTION

This invention relates to a method and system of storing and retrieving data, to computer memory storage systems, and to the formation and playback of ultra high speed holographic movies. This invention particularly relates to optical data storage methods and systems.

BACKGROUND OF THE INVENTION

The simplest optical data system stores and recalls data by means of either absorption or reflection of a light beam. A series of data bits can be stored and read by directing a beam of light to a series of data storage locations.

Frequency selective optical data storage (FSDS) systems were first reported by Szabo in U.S. Pat. No. 3,896,420. In FSDS systems, data bits are stored and recalled on the basis of not only their spatial coodinates but also their spectral characteristics. In this method, a storage material, which exhibits an inhomogeneously broadened absorption profile, and which contains many homogeneous absorption channels, is exposed to a highly monochromatic laser beam. At a single spatial location, the laser beam burns a large number of "holes" at discrete absorption frequencies throughout the broad inhomogeneous absorption profile of the storage material. The multi-bits of information stored at each spatial location are recovered by scanning across the material's absorption profile with a highly monochromatic laser, while at the same time monitoring the absorption profile of the storage material to detect the presence or absence of data "holes". The theoretical limit to the number of bits stored at a single location is related to the ratio of the inhomogeneous absorption bandwidth of the material, $\Delta f_I$, to the homogeneous absorption bandwidth of the material, $\Delta f_H$. In some materials, the inhomogeneous width is approximately one million times larger than the homogeneous width. Therefore, theoretically about one million bits of information could be stored in a single region of a few square microns.

The "hole" burning (or frequency-domain) FSDS systems have a number of major drawbacks, one of which is their relative slowness. The maximum speed at which holes can be burned is determined by the relationship $\Delta t_c \Delta f_c \simeq 1$, where $\Delta t_c$ is the single channel access time and $\Delta f_c$ is the single channel spectral width. Therefore, if the storage capacity of the absorbing material in the frequency domain system is increased by making each data channel spectrally narrow, one unavoidably increases the time needed to create and retrieve information from that single data channel. Maximum storage density and maximum access speed are thus incompatible in the frequency domain FSDS systems.

This invention relates to a time domain FSDS method and system, which provides for the storage in one spatial location of a large number of data bits during the time interval required to write one bit in frequency-domain FSDS systems.

RELATED DEVELOPMENTS

Investigations into the electronic energy level structure of atoms and molecules utilizing laser pulses have demonstrated the existence of "echo" signals which samples of inhomogeneously broadened media emit in response to multiple laser excitations. The first such "echoes", termed photon echoes, were reported in 1964 by Abella, Kurnit and Hartmann, and discussed in their article "Photon Echoes", *The Physical Review*, Vol. 141, No. 1, 391–406 (January 1966). Zuikov et al., in JETP Lett., Vol. 32, No. 4, (August 1980), reported a correlation between the echo signal emitted by an excited sample material and two low intensity pulses in a four pulse excitation sequence and suggested that this correlation could be applied to an optical delay signal device. The Zuikov pulse sequence requires a first and fourth pulse occurring within a time interval of less than about 80 nsec and having an intensity much greater than the second and third pulse intensities (on the order of magnitude of ten to one). The intensity requirements of the Zuikov method effects a reduction in intensity of uncorrelated signals appearing in the echo. The Zuikov reference does not teach a method of accurately storing and accessing complex signals comprising a large number of discrete pulses.

The application of the echo correlation effect as a method of storing and retrieving accurately over extended periods of time useful data comprising a large number of discrete data bits has heretofore not been appreciated.

A non-volatile computer memory system which can store and accurately reproduce a time modulated data signal in single spatial locations of a storage material has also heretofore not been appreciated.

The present invention defines the parameters heretofore unappreciated by the prior art, which parameters are required for the accurate and noise-free storage and reproduction of useful data.

SUMMARY OF THE INVENTION

This invention comprises a method of storing data comprising the steps of:

providing a material exhibiting inhomogeneous absorption transition linewidth broadening and having the characteristic of undergoing transitions from the ground state to excited states upon exposure to electromagnetic radiation having spectral components within said inhomogeneous linewidth; exposing said material to an information-containing writing pulse comprising a modulated pulse of electromagnetic radiation consisting essentially of spectral components within the inhomogeneous absorption transition linewidth of said material; exposing said material to a fixing pulse of electromagnetic radiation consisting essentially of spectral components having uniform amplitude and phase throughout the spectrum of said writing pulse; wherein said material is exposed to said writing pulse and said fixing pulse within a period of time less than or about the homogeneous dephasing time of said absorption transition within said material, and wherein the intensity of each said pulse is not greater than required to cause about one half of the ground state population of said material to make the transition from the ground state to an excited state of said material; thereby resulting in the storage in said material of said writing pulse information.

Another aspect of the method according to this invention is the non-volatile storage of information by providing a material which undergoes a photoinduced reaction in the excited state, thereby resulting in the storage of information contained in the writing pulse in the ground state population of the absorbing atoms or molecules of the storage material.

This invention also comprises a method of reading stored data comprising the steps of: storing data in a location of the storage material as described above; exposing said location to a reading pulse comprising electromagnetic radiation consisting essentially of spectral components having uniform amplitude and phase throughout a spectral region sufficiently broad to ensure uniform excitation of said stored information; thereby inducing said material to emit a free-induction decay signal containing said stored information; and receiving and detecting said free-induction decay signal.

Another aspect of the method according to the present invention relates to the detection of a relatively noise-free data signal by providing for an information-containing free-induction decay signal emission in a vector direction other than the direction of the reading pulse and non-information-containing signals.

This invention also relates to a data storage system using the method according to this invention.

This invention also relates to a non-volatile data storage system, comprising either an erasable or nonerasable memory.

Another aspect of this invention is the utilization of the data storage method to provide a means for the production of ultra high speed holographic motion picture images.

DETAILED DESCRIPTION

The preferred method of the present invention comprises the excitation of a storage material with a writing pulse and a fixing pulse. The writing pulse contains information in the form of a time modulated signal (amplitude or frequency modulated), while the fixing pulse is a reference pulse of relatively short duration, and comprises spectral components which are uniform in amplitude and phase throughout the spectrum of said writing pulse. The electromagnetic pulses are preferably laser pulses. Each pulse has a central frequency (f) corresponding to about the central absorption frequency of an inhomogeneously broadened absorption transition of a storage material, wherein said material exhibits one or more inhomogeneously broadened absorption transitions, each comprising a large number of homogeneous absorption linewidths.

The time interval during which the storage material is exposed to the writing and fixing pulses is less than or about equal to the homogeneous dephasing time ($T_2$) of the particular absorbing transition and therefore is short enough so that the absorbing atoms or molecules in the storage material "see" the "interference" sum of the electromagnetic fields of both pulses. The spectral components of this "interference sum" vary in frequency in such a manner as to be representative of the temporal structure of the writing pulse. The new result is that the material stores the time modulated information in the homogeneous frequency subpopulations of the inhomogeneously broadened absorption transition. This frequency information is stored in both the ground state population and the excited state population, separately and independently, thereby enabling the storage system to preserve the ground state (or excited state) information-containing structure by removing the excited state population (or ground state population) according to its differential reactivity.

The stored information may be read by scanning the absorption band of the storage material by a frequency tuned laser according to method known in the art.

The preferred reading method of the present invention comprises interrogating the storage material containing the stored data with a reading pulse which produces a free-induction decay emission signal. When the information-containing population in the storage material is excited so as to produce a free-induction decay signal, that signal under the conditions described herein represents either a reproduction of the writing pulse or a time reversed reproduction of the writing pulse, depending on whether the fixing pulse occurs before or after the writing pulse, respectively.

The reading pulse may be tuned to about the same frequency as the fixing and writing pulses or to the frequency of an entirely different inhomogeneously broadened absorption transition of the storage material, provided that the inhomogeneous frequency destributions of the two transitions are correlated. When the reading pulse frequency is resonant with the same absorption transition as the fixing and writing pulses, the variables defining the reading pulse are identical to those defining the fixing pulse. When the frequency of the reading pulse is centered at a second absorption transition, the variables defining the reading pulse are dependent on said second absorption transition in accordance with the calculations discussed below.

The preferred intensity of the reading pulse is about equal to that required to cause about half of the ground state information-containing population of the storage material at any particular absorption frequency to make a transition from the ground state to an excited state.

Figure 4:
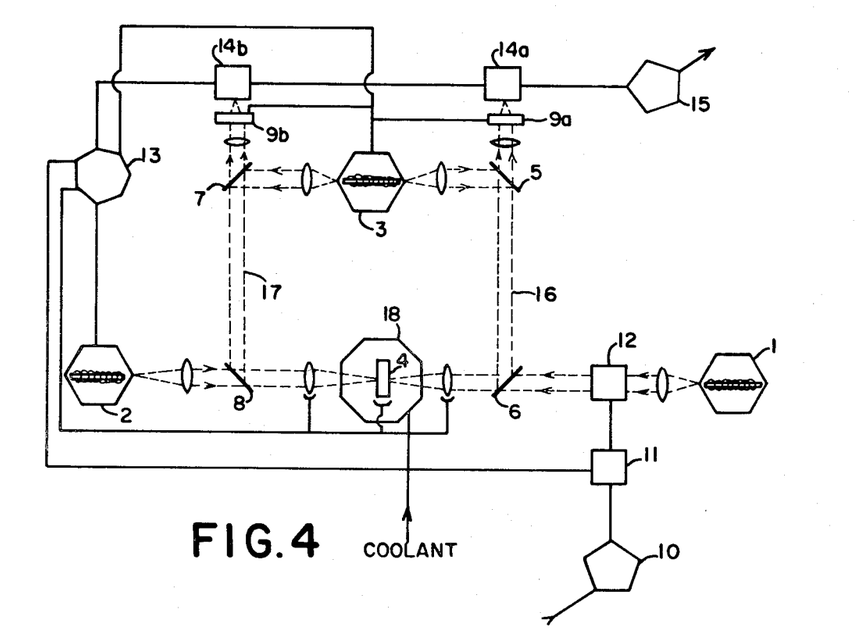
FIG. 4 is a schematic representation of an exemplary data storage system according to this invention.

FIG. 4 represents an exemplary data storage system designed to write and retrieve a sequence of data pulses onto and from a matrix of spatial locations of a storage material, 4. For simplicity, the writing, fixing, and reading pulses are provided by three separate laser sources, 1, 2, and 3 as shown, although one or two laser sources can be adapted to provide the necessary excitation pulses. The material, 4, is exposed to these beams along one axis with the only variable being the direction in which the beam may propagate through the material. The writing laser, 1, and fixing laser, 2, are positioned so as to propagate a writing and fixing pulse, respectively, through the storage material, 4, at a specific spatial location from the right and from the left directions, respectively. A reading laser, 3, the function of which may be taken by the writing laser, 1, (or the fixing laser, 2), is positioned so as to deliver a reading pulse along the same direction of propagation as the writing pulse (or fixing pulse), by using a series of mirrors, 5 and 6 (or 7 and 8). A detector, 14a or 14b, is positioned at a location in the propagation path of the resulting free-decay signal (hereinafter referred to as the data signal).

It should be understood that the placement of the laser sources 1, 2, and 3 and material, 4, are exemplary only, provided that the writing, fixing, reading, and data signal vector directions, $\vec{k}_w$, $\vec{k}_f$, $\vec{k}_r$, and $\vec{k}_d$, respectively, are related according to $\vec{k}_d = \vec{k}_r + \vec{k}_f - \vec{k}_w$ when the writing pulse is first, and $\vec{k}_d = \vec{k}_r - \vec{k}_f + \vec{k}_w$ when the writing pulse is second, and satisfy the condition $|\vec{k}_d| = |\vec{k}_r|$.

Figure 1:
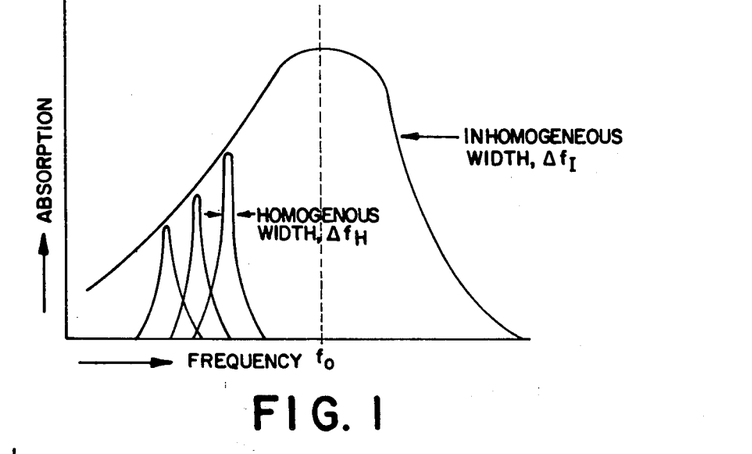
FIG. 1 is a graph of absorption vs. frequency and shows an inhomogeneous absorption curve of linewidth $\Delta f_I$ including homogeneous linewidths $\Delta f_H$, which absorption curve is a required absorption characteristic of the storage materials used in the present invention.
Figure 2:
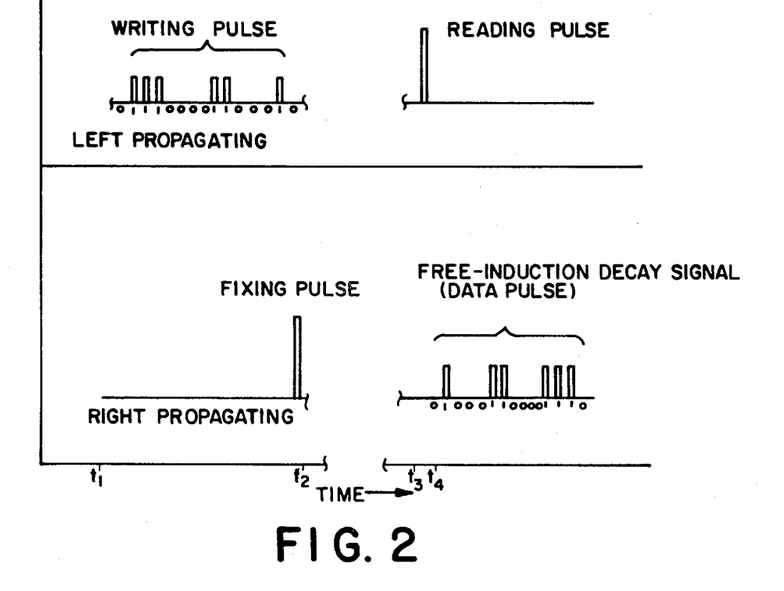
FIG. 2 is a schematic representation of an exemplary pulse sequence according to the method of this invention and shows the sequential excitation of a storage material with a writing pulse and a fixing pulse; and, the production of a free-induction decay signal by application of a reading pulse. The propagation direction of each pulse is indicated.
Figure 3:
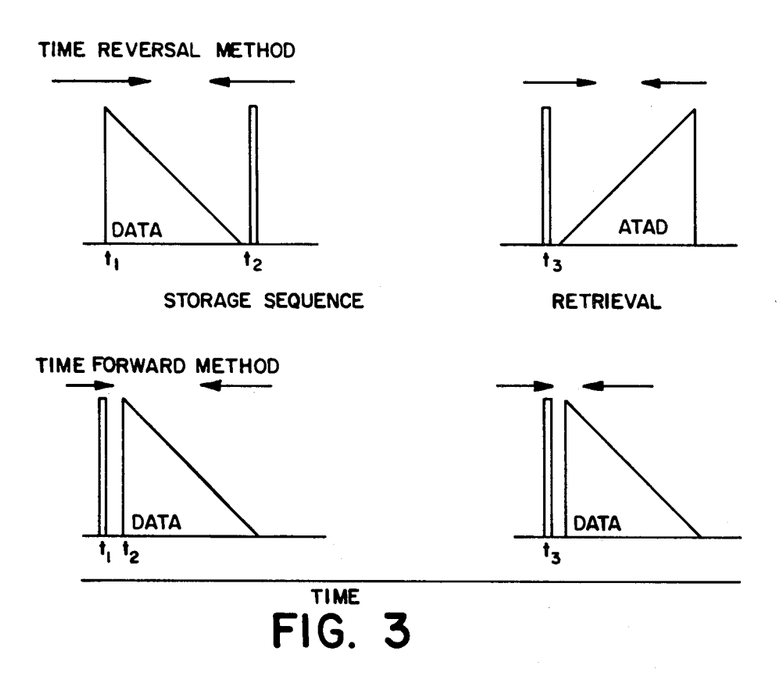
FIG. 3 represents the temporal relationship between the writing pulse and the information-containing free-induction decay signal (data pulse), which relationship depends on the temporal sequence in which the storage material is exposed to the writing and fixing pulses.

Referring to FIG. 2, it is seen that a sequential excitation of the storage material with a writing and fixing pulse, in that order, is effected by exposing the storage material, 4, to a writing pulse comprising a sequence of "0" and "1" data bits, propagating to the left and emanating from the right, followed immediately by exposing the storage material, 4, to a fixing pulse propagating to the right and emanting from the left. When the material, 4, is exposed to a reading pulse propagating from the right to the left, a free-decay signal comprising the information contained in the writing pulse is emitted by the sample and propagates to the right, that is, in the opposite direction from the reading pulse. As shown in FIG. 3, and as mentioned above, when the fixing pulse follows the writing pulse in time, the subsequent data pulse comprises a time-reversed replica of the writing pulse. In FIG. 4, the reading pulse follows path 16. On the other hand, when the fixing pulse precedes the writing pulse in time, the writing pulse is faithfully reproduced when the reading pulse propagates from left to right. In FIG. 4, the reading pulse follows path 17.

In FIG. 4, partial mirror 6 or 8, positioned at 45° from the path of writing pulse propagation reflects the free-decay signal toward the detector, 14a or 14b, respectively, and a shutter, 9 or 9a, is provided to protect the detector from extraneous radiation during the writing and interrogation processes.

A cryostat, 18, is shown in FIG. 4, which is necessary to keep certain storage materials at low enough temperatures to exhibit a large number of homogeneous frequencies.

FIG. 4 also shows a data input, 10, which channels data into a device named the segmentor, 11, containing a logic circuit. The segmentor, 11, divides the continuous data into discrete packets of data containing an appropriate number of data bits capable of being written by each writing pulse. The number of data bits which can be written by a single writing pulse is discussed in more detail below and is dependent on such factors as the sensitivity of the detector, the ratio $\Delta f_I / \Delta f_H$, and the transition moment of the storage material. The packets of data bits are relayed to the modulator, 12, which then modulates the writing laser beam in an information-containing way and limits the duration of the beam to less than or about $T_2$, the homogeneous dephasing time of the storage material.

The matrix sequencer, 13, comprises a timing and logic circuit known in the prior art and provides for the sequential positioning of discrete storage locations in the material and for the coordination of the delivery of a discrete fixing and writing pulse for each storage location. Either the storage material or the pulses may be aligned by the sequencer in order to store a sequence of writing pulses. Methods and systems for altering the data storage location are known in the prior art.

Retrieval of information is provided for by the operation of the reading laser in combination with the matrix sequencer, 13. The matrix sequencer, 13, arranges a sequence of information-containing storage locations for exposure to discrete reading pulses. The sequencer, 13, activates the reading laser, 3, to pulse each successive storage location, and, subsequent to the emission of successive information-containing free-decay signals, provides the successive storage locations for further interrogation. The operation of the matrix sequencer, 13, provides a sequence of free-decay signals for detection by the detector, 14a or 14b, and provides a useful continuous data output signal.

The following examples are only two embodiments of the data storage and retrieval method according to this invention.

EXAMPLE 1

The storage material is a 1.0 atomic % sample of $Pr^{3+}$ ions in a crystal matrix of $LaF_3$. Long-lived stimulated echoes have been observed on the $^3P_0$-$^3H_4$ transition of this material and reported in the literature. The crystal matrix is prepared as according to methods known in the art.

The storage material is a 1 mm thick slab of material about one absorption length thick, that is, about 70% of the incident light is absorbed on passing through the material. The storage location has a spatial spot size of dimension fifteen microns by fifteen microns, and an area s of $\simeq 2 \times 10^{-6}$ cm$^2$. The Einstein coefficient (A) corresponding to the absorbing transition in this material is about $10^4$. The wavelength of the transition, $\lambda$, is about $4.77 \times 10^{-5}$ cm. The temperature of the storage material is maintained at about 2.2° K., using a liquid helium cryostat. The coherence time of the writing laser, $\tau_c$, is about one nanosecond, and $\tau_B$, the duration of each data bit in the writing pulse, is about five nanoseconds. The inhomogeneous dephasing time, $T^*_2$, is much less than $\tau_c$.

The laser arrangement is shown in FIG. 4. At $t_0$, the fixing laser, 2, having a coherence time similar to that of the writing laser, is turned on for a duration of about $\tau_c$ and has a power of about 100 milliwatts. An information-containing digital signal of up to about 200 data bits and comprising a sequence of at most 25 "1" bits is fed into the laser modulator, 12. The laser beam emanating from the writing laser, 1, having a power of 0.2 milliwatts, is allowed to pass through the modulator, 12, at $t_0 + 10$ nsec. The modulator, 12, modulates the beam according to the information-containing signal and provides essentially rectangular pulses for the "1" bits and prevents the transmittal of the laser beam during the "0" bits.

The reading laser, 3, having a coherence time similar to that of the writing laser, is turned on at $t_0 + 3$ minutes and a pulse of duration of about 1 nanosecond is allowed to pass through the storage location in the same direction as the fixing pulse (path 17). The power level of the reading laser is the same as that of the fixing laser. All pulses are resonant with the $\lambda \simeq 4.77 \times 10^{-5}$ cm, $^3H_4$-$^3P_0$ transition of the material.

The storage material emits a free-decay signal in the opposite direction of the reading pulse propagation at $t = t_0 + 3$ min + 10 nsec, and is detected by detector, 14b. The data signal comprises a time forward reproduction of the data bits written by the writing pulse.

It should be noted that in the above example, only about one gigahertz of the available inhomogeneous bandwidth of the $^3H_4$-$^3P_0$ transition is utilized. If a larger portion of the inhomogeneous bandwidth were utilized (by making $\xi_c$ shorter), more data will be stored in any given location on the storage material. In addition, if a material is chosen which has a transition moment which is weaker than that of the above material but the absorption length of the material is maintained at unity, or a larger spatial location of the storage material exposed to the pulse sequence, a greater quantity of data bits can be stored in the location.

The next example utilizes a storage material in which the data pulse is permanently stored.

EXAMPLE 2

The storage material comprises a $10^{-5}$ wt% cyrstal of cinnoline of the formula in naphthalene. A slab of this material of thickness one absorption length thick is cut from a crystal grown according to the method of Burland, U.S. Pat. No. 4,158,890, hereby incorporated by reference. The absorption transition is at 4490 Å and exhibits an inhomogeneously broadened linewidth at about 3° K. having an inhomogeneous width of about 4 Å.

A spatial spot size of about $10^{-6}$ cm$^2$ is exposed to the writing and fixing pulse as in Example 1. The writing pulse comprises about 50 data bits containing 25 "1" bits. The spot is exposed to a reading pulse at $t_0+30$ minutes. The storage material emits a free-decay signal which is detected by detector 14b and which comprises a time forward reproduction of the data bits written by the writing pulses.

The following section discusses the various components of the method and system according to the present invention.

DATA STORAGE SYSTEM COMPONENTS

Pulse sources. This invention requires a fixed frequency electromagnetic source of radiation. While lasers of optical frequencies are preferred, other bands of electromagnetic radiation may be utilized depending on the type of storage material. Examples of lasers which are suitable for use in the present invention include semi-conductor diode lasers, cw dye-lasers, and nitrogen laser-pumped or eximer laser-pumped dye-lasers. A preferred laser source for the writing pulse has a coherence time $\tau_c$ less than or about $\tau_B$. However, in no case should the coherence time of the writing laser be less than the inhomogeneous dephasing time of the absorption transition.

Frequency. The frequency of the electromagnetic radiation sources depends on the absorption transition of the storage material. While the entire electromagnetic absorption spectrum of the material may be used, frequencies within the ultraviolet, infrared, and visible spectra are preferred. The central frequencies of the writing and fixing pulses are about the same. The reading pulse frequency may be the same or be at a frequency of a correlative transition.

Modulator. The modulator alters either the frequency or the amplitude of the writing pulse in an information-containing way. The simplest modulation scheme is simply on or off: for example, the "on" time may represent binary ones, and the "off" time represent binary zeroes. The fixed temporal width of each bit, $\tau_B$, it optimized with regards to maximum data storage capability when it is set at about $T^*_2$, the inhomogeneous dephasing time of the storage material. The modulator can be an acousto-optic, electro-optic, or analogous device which operates on this time scale and which is commercially available.

Detector. The detector should be able to respond to the time scale of approximately that of a data bit, i.e. $\tau_B$, which is on the order of or greater than the inhomogeneous dephasing time of the storage material, $T^*_2$. $\tau_B$ is preferably about 0.1 to about 10 nanoseconds and, for example, 5 nanoseconds. Commercial semiconductor avalanche photodiodes and photomultiplier tubes are available which respond on this time scale and can serve as detectors.

The sensitivity of the detector is one determining factor relating to the number of data bits stored at a single spatial location. To achieve a signal to noise ratio of about 10, a detector requires a certain number of photoelectrons per data bit. If a detector needs 100 photoelectrons for such a signal, exhibits a 10% quantum efficiency, and collects only about 10% of a highly directional data pulse (yielding an overall detection efficiency of 1%), then at least $10^4$ emitted photons are needed per "1" data bit.

As discussed below, the storage material is at best capable of reproducing 1/200th of the photons in the writing pulse; therefore, with a detection scheme requiring $10^4$ photons per bit, each writing pulse data bit must contain at least $2 \times 10^6$ photons.

Pulse Intensities. The intensities of the writing, reading, and fixing pulses are related to the function $\theta_x(f)$ of the electromagnetic fields of each pulse. The preferred intensity of each said pulse is such that each pulse causes no more than about half of the absorbing atoms or molecules of the storage material at any particular absorption frequency to undergo a transition from the ground state to an excited state. In terms of $\theta_x(f)$; $\theta_x(f) \leq \pi/2$ for all f.

PREFERRED FIXING AND READING PULSE INTENSITY

The values for $\theta_f$ and $\theta_r$ which will maximize the intensity of the data signal are $\theta_f \approx \pi/2$ and $\theta_r \approx \pi/2$. Larger values of $\theta_r$ and $\theta_f$ will tend to reduce the size of the data signal because of destructive interference between different portions of the illuminated cross-sectional area of the material. This effect arises because of the intensity profile of the laser pulses across the illuminated area of the storage material.

The optimum intensity of the reading and fixing pulses of duration $\tau_c$ is given by the formula $$I_x = c\pi^3 h / 24 A \lambda^3 \tau_c^2.$$

PREFERRED WRITING PULSE INTENSITY

The writing pulse area (discussed in more detail below), $\theta_w$, is preferably $\leq 1$ and ensures accurate writing pulse information storage and retrieval.

The maximum and minimum intensities of the writing pulse are related by the following formulae, $$I_w^{min} \geq \frac{N_{min} \cdot hc}{\lambda \tau_B s},$$ where $N_{min}$ is the minimum number of photons in each data bit ("1"), and is determined by the detector sensitivity, and $$I_w^{max} \leq \frac{c\pi h}{6\lambda^3 \tau_c A t_w'},$$ where $A$ is the Einstein $A$ coefficient associated with the absorption transition, and $t_w'$ represents the total duration that the writing laser is actually on. In particular, the duration of zero bits is excluded.

The variables in the above formula are defined and discussed below.

Power output. The power of the electromagnetic radiation sources depends on the absorption characteristics of the storage material and is given by the formula $I_x \cdot s$. The power is related to the intensity of the pulse and the spatial spot size and, for example, may range from 0.01 to 500 milliwatts, preferably from 0.1 to 250 milliwatts, and, most preferably, from 0.5 to 150 milliwatts.

Pulse duration. To obtain maximal data storage at each spatial location, the electromagnetic radiation sources for the fixing and reading pulses must operate for a duration of about $T^*_2$, the inhomogeneous dephasing time of the absorption transition, and the electromagnetic radiation source for the writing pulse must operate for about $T_2$, the homogeneous dephasing time of the absorption transition. Sources providing longer fixing and reading pulses may be employed but with concomitant loss of storage capacity. Similarly, shorter writing pulses may be employed.

PREFERRED WRITING PULSE DURATION

For the minimum and maximum intensity conditions to be consistent in any one system according to this invention, the duration of the writing pulse $t_w'$ must be $$t_w' \leq \pi s / 6\lambda^2 A \cdot N_{min}(\tau_B/\tau_C).$$

For each system, $t_w'$ is unique and depends on the Einstein coefficient $A$ (related to the transition moment of the absorption transition and the absorption wavelength), the spatial location cross sectional area, the minimum number of data photons required for detection, and the ratio $\tau_B/\tau_C$.

An exemplary system has the following variables: $\tau_B = \tau_C = 10^{-9}$ sec; $A = 10^3$; $N_{min} = 2 \times 10^6$; $\lambda = 6 \times 10^{-5}$ cm; and $s = 10^{-6}$ cm$^2$.

Substitution of the variables into the above formula results in $t_w' \leq 72$ nanoseconds. Since this $t_w'$ is for the maximum intensity writing pulse (all "1" bits), the total writing pulse time, $t_w$, is $(72 + t°_w)$, wherein $t°_w$ is the total time of the "0" data bits. In this system, a writing pulse comprising about half "0"s and about half "1"s provides for as much as 144 bits to be written in one spatial location. The break-off point in this system for the number of bits in any one spatial location is the total number of "1" bits, which is equal to 72.

Segmentor. The segmentor comprises a logic and timing circuit adapted to control the modulator in response to a data input signal and designed to provide an appropriate amount of data for each discrete writing pulse.

One type of segmentor control function divides the data input signal into discrete signals of uniform time equal to $t_w'$, (less than the homogeneous dephasing time of the storage material) wherein $t_w'$ is determined by the maximum allowable writing pulse field [that is, where all data bits equal "1"] according to the system parameters discussed above.

A second type of segmentor control function divides the data signal into segments of non-uniform duration, each writing pulse signal comprising a maximum allowable number of "1" data bits. The segmentor logic circuit counts the "1" data bits in the data input signal and cuts off each signal at a point where either the number of "1" bits reaches the maximum number or where the signal approaches the homogeneous dephasing time of the storage material. In this segmentor control method, the segmentor provides an initiation code sequence of about 8 bits at the beginning of each signal segment, which sequence encodes the duration of each specific writing pulse. This code is subsequently read by the matrix sequencer, thereby signaling the termination time of each data signal and thereby providing the matrix sequencer with the necessary timing information in which to allow: the storage location to emit the complete data output signal; the successive reading pulses to be applied to the successive storage locations; and, for a coherent continuous data-output signal to be created from the free-decay signal sequence.

Storage materials. A sample must exhibit inhomogeneous absorption linewidth broadening comprising a large number of homogeneous linewidth frequencies within the inhomogeneous line bandwidth. The number of data bits in the frequency dimension is determined by $\Delta f_I/\Delta f_H$, the ratio of inhomogeneous bandwidth to the homogeneous bandwidth. $\Delta f_H$ is known in the literature to be about as narrow as ten kilohertz and $\Delta f_I$ as large as ten gigahertz. The ratio of these two quantities raises the possibility of storing $10^6$ bits of information in a single region of the storage material only a few microns in extent. Since $\Delta f_H$ is in most instances much smaller at low temperatures, such as, for example, about 1° K. to about 70° K., and preferably about 2° K. to 4° K., the storage capacity of the memory is higher at low operating temperatures.

There are various classes of storage materials which exhibit the inhomogeneous/homogeneous absorption transition phenomenon and which may be used in the present invention. These classes include materials which provide a temporary memory, a permanent destructible memory, and a permanent erasable memory. The materials which exhibit a temporary memory are those materials in which the excited state population relaxes to repopulate the terminal level of the ground state in such a way as to perturb the stored data in the ground state population within a period of a few microseconds to tens of minutes. The length of time for which the memory persists is related to the relaxation time of the hyperfine levels of the ground state and the excited state lifetime.

One unique aspect of the readout method according to this invention is that the data signal produced can be stored over a longer period of time than simply a few seconds, and for as long as 30 minutes or more, due to the distribution of hyperfine ground state levels. See T. W. Mossberg, Ph.D. dissertation, Columbia University (1978) (University microfilms, Ann Arbor, MI), herein incorporated by reference. Exemplary materials that may be used for this type of memory material are chromium-doped ruby, chromium-doped magnesium oxide, $Pr^{+3}$-doped crystals of $LaF_3$, single crystals of $EuP_5O_{14}$, $PrP_5O_{14}$, $NdP_5O_{14}$, and $TbP_5O_{14}$, color centers in alkali halides, and micro-ions in alkali halides, specifically $O_2$, $S_2$, $Se_2$, SeS in KI, materials which are known in the prior art. Certain storage materials, such as chromium-doped ruby, exhibit a reduced homogeneous absorption transition linewidth in the presence of an externally applied magnetic field. Such a field has been described in the prior art by Zuikov et al., supra, and could be utilized in the present invention in conjunction with such materials.

The storage materials utilized in this invention may be adapted to undergo a photo-induced reaction upon exposure to the writing and fixing pulses. The material undergoes a photochromic or photochemical reaction thereby removing the excited state population and preserving the character of the ground state subfrequency population distribution. Examples of such materials are the free base porphyrin ($H_2P$) and tetrazine in certain matrixes such as n-octane or durene. An example of a reversible photochromic reaction is the free base porphyrin, while an example of an irreversible photochemical reaction is tetrazine. Another example of a material which undergoes an irreversible photochemical reaction is reported by Burland, in U.S. Pat. No. 4,158,890. This material consists of a cinnoline type material suspended in a crystal matrix of naphthalene or durene.

The erasable storage method and system according to the present invention comprises a storage material which upon irradiation at a first frequency $f_0$, undergoes a photochemical reaction in the excited state (thereby preserving the ground state population distribution) and which upon irradiation at a second frequency, $f_1$, repopulates the ground state population of the storage material. These materials may be suspended in a matrix, as mentioned above, and exemplary materials are, for example, phthalocyanine in a polymer matrix such as polymethacrylate and those systems disclosed in U.S. Pat. No. 4,288,861, herein incorporated by reference. Exemplary materials include: the 6,6'-diethoxythioindigo dyes and derivatives thereof which are convertible between their cis- and trans- forms using two different wavelengths; the oroxides, described in U.S. Pat. No. 3,329,502, herein incorporated by reference; N,N'-diacetylindigo, and other compounds known in the art.

Another class of materials which can be used in an erasable storage system according to this invention are materials which undergo a photochemical reaction which is thermally reversible. Exemplary materials are quinizarin and related dyes of the anthraquinone/naphthaquinone series in a matrix comprising, for example, a boric acid glass.

ULTRA HIGH SPEED HOLOGRAPHIC MOVIES

This invention also relates to a method for creating and reproducing an ultra high-speed holographic movie and projection. The ultra high speed motion of an object is recorded by the following method. An object is exposed to a laser pulse and the light scattered off the object is made incident on a storage material, said storage material being of the same type described above. The effect the scattered light has on the storage materials is the same as that produced by the writing pulse descussed above. A plane-wave fixing pulse passes through the storage material either before or after the scattered-wave writing pulse. The motion of the object as represented by the scattered-wave writing pulse is stored in the material.

The three dimensional motion may be played back by passing a plane-wave reading pulse through the hologram. The fixing and reading pulses have the same characteristics described above for the memory system except that they are high quality plane waves. Since the inhomogeneous widths of the storage materials are typically on the order of $10^9$ to $10^{10}$ hertz, motion of the object on the 0.1-1 nanosecond time scale is recorded. If the scattered-wave writing pulse occurs before the fixing pulse, and the fixing and reading pulses counter-propagate through the storage material according to the vector equation described above, the free-decay signal is a temporally and spatially reversed propagating reproduction of the scattered-wave writing pulse. In this method the orientation of the scattered-wave writing pulse in respect to the fixing and reading pulses is not critical. If the fixing and reading pulses propagate in the same direction, and the scattered-wave writing pulse occurs after the fixing pulse, the free-decay signal is a temporally and spatially forward propagating reproduction of the scattered-wave writing pulse. The physics involved in the present invention is discussed in the following section. An understanding of the terms defined below will be helpful in appreciating the various aspects of the present invention.

$\Delta f_H$ is the homogeneous linewidth of an inhomogeneously broadened transition within the storage material.

$\Delta f_I$ is the inhomogeneous linewidth of a transition of the storage material.

$T_2 \cong 1/\Delta f_H$ is the homogeneous dephasing time associated with a particular subpopulation of atoms or molecules, which subpopulation comprises a homogeneous frequency bandwidth within the inhomogeneously broadened linewidth of the storage material.

$T^*_2 \cong 1/\Delta f_I$ is the inhomogeneous dephasing time associated with the population of atoms or molecules within the inhomogeneously broadened linewidth of the storage material.

$t_x$ is the temporal width of the $x^{th}$ pulse, wherein x is w, f, r, which represent writing, fixing, and reading, respectively.

$\tau_B$ is the temporal width of each data bit within the overall writing pulse.

$\lambda$ which equals $hc/f$, is the wavelength of the absorbing transition.

$I_x(t)$ is the net intensity of pulse x, wherein x is w, f, r, or d, which represent a writing, fixing, reading, or data pulse, respectively.

$E_x(t)$ is the net electrical field of pulse x as a function of time.

$E_x(f)$ is the Fourier transform of $E_x(t)$ from time to frequency space.

p is the electric dipole (or higher moment) of the absorbing transition.

$=h/2\pi$ where h is Planck's constant.

$\theta_x(f) = 2p|E_x(f)|/h$, which is the "area" of pulse x at frequency f.

s is the area illuminated on the sample, or in other words, the area of a single spatial data location.

$\tau_L$ is the radiative lifetime of an excited state.

$\phi_x$ is a fluctuating phase factor.

$\alpha(f)$ is the optical absorption coefficient as a function of frequency.

c is the speed of light in a vacuum.

l is the thickness of the storage sample.

$\tau_c$ is the coherence time of the writing pulse laser.

$t_w'$ is the total "on" duration of the writing laser. This duration is defined with regards to the case where amplitude modulation of the writing laser is utilized to write binary "0"s and "1"s.

INFORMATION STORAGE

The electromagnetic pulses comprising the writing, fixing, reading and data pulses can be described by Formula I.

$$E_x(t-\eta_x) = \epsilon_x(t-\eta_x) \cos[2\pi f_x(t-\eta_x) + \phi_x) + \phi_x], \quad \text{I}$$

where $$\eta_x = \left(\frac{n\hat{k}_x \cdot \vec{r}}{c}\right) + t_x,$$

wherein n is the index of refraction of the material, $\hat{k}_x(\vec{r})$ is the unit wave vector associated with the pulse which may vary as a function of $\vec{r}$ if the pulse is not a plane wave, and $t_x$ is the time at which the leading edge of the pulse reaches the arbitrary location $\vec{r}=0$, which for simplicity we can define as the center of the storage material.

It is assumed that the envelope function $\epsilon_x(t-\eta_x)$ varies slowly compared to one optical cycle and is a real-valued function.

The Fourier transform of $E_x(t)$ into frequency space may be written as Formula II.

$$E_x(f) = \int_{-\infty}^{\infty} E_x(t-\eta_x) e^{-2i\pi ft} dt \quad \text{II}$$

Since pulsewidth considerations guarantee that $E_x(f)$ is relatively constant over each frequency interval $1/t_x$, then each pulse would be seen by an absorbing atom of frequency $f_a$ as an electric field of the Formula III.

$$e_x^{\text{eff}} = (1/t_x)(E^*_x(f_a)e^{-i2\pi f_a t} + c.c.). \quad \text{III}$$

The sequential excitation of a storage material by two pulses, both having the form given above (subscripts 1 and 2 denote their temporal order) and which are applied within the interval $T_2$, results in a ground stage population, $\rho_{gg}(f_a)$, which can be described by the density matrix element of Formula IV, and contains three terms. (The excited state population may be described by a corresponding density matrix element $\rho_{ee}$, not shown here but of similar form). (For derivation of this relationship, see, for example, T. W. Mossberg, R. Kachru, S. R. Hartmann and A. M. Flusberg, "Echoes in Gaseous Media: A generalized theory of rephasing phenomena", Physical Review, Vol. 20, No. 5, 1976–1996 (Nov. 1979).)

$$\rho_{gg}(f_a) = \rho_{gg}^{(1)} + \rho_{gg}^{(2)} + \rho_{gg}^{(12)} = \cos^2(\theta_1/2)\cos^2(\theta_2/2) + \sin^2(\theta_1/2)\sin^2(\theta_2/2) - \sin(\theta_1)\sin(\theta_2) \\ [E^*_1(f_a)E_2(f_a) + E_1(f_a)E^*_2(f_a)]/4|E_1(f_a)||E_2(f_a)| \quad \text{IV}$$

The first two terms of Formula IV represent the pulses only through their representative power spectra. However the third term, $\rho_{gg}^{(12)}$, represents the interference between the two pulses and contains both $E_1(f_a)$ and $E_2(f_a)$ terms, explicitly. If one of the pulses has a particularly simple spatial and spectral structure, the structure of $\rho_{gg}^{(12)}$ is determined by and represents the spatial and spectral structure of the other pulse. According to the instant invention, the simple structure (i.e., a constant amplitude and phase of spectral components over the spectral width $1/t_f$) of the fixing pulse guarantees that the writing pulse is represented in both the ground and excited states of the material.

The most accurate representation of the writing pulse is achieved in the ground or excited state population gratings if the area of the writing pulse, $\theta_x(f) \leq 1$ for all f (x is 1 or 2) so that the approximations, $\cos\theta_x = 1 - \theta_x^2/2$ and $\sin\theta_x = \theta_x$, are essentially correct.

The requirement that $\theta_w(f) \leq 1$, limits the amplitude and intensity of the writing pulse to a level which would cause less than about one half of the ground state population of the storage material at any particular absorption frequency to make a transition from the ground state to an excited state of said material. Similarly, the optimization value for $\theta_f \simeq \pi/2$, discussed in more detail below, also limits the amplitude and intensity of the fixing pulse to a level which would cause about one half of the ground state population to make an interstate transition.

When $\theta_w \simeq 1$, the information structure in the subfrequency population distributions is optimized so that the retrieval of this structure (discussed in more detail below) information is maximized.

In addition, the writing and fixing pulse intensities, discussed in more detail below, are restricted to levels where power broadening is insignificant. Therefore, each pulse's effect on an absorbing atom or molecule is to a good approximation identical to that of a resonant pulse of area, $\theta_x(f_a)$ defined by Formula V, $$\theta_x(f_a) = 2p/\hbar|E_x(f_a)|, \quad \text{V}$$

where x is w or f, p represents the transition matrix element (for simplicity we treat p and the electric field as scalars). After making the appropriate substitutions in Formula IV, the information-containing ground state population matrix term, $\rho_{gg}^{(12)}(f_a)$, materializes as:

$$\rho_{gg}^{(12)}(f_a)\alpha[E^*_1(f_a)E_2(f_a) + c.c.]$$

Examination of $\rho_{gg}^{(12)}$ (and $\rho_{ee}^{(12)}$) reveals that the material stores information in the form of subfrequency population distributions. The writing pulse-fixing pulse pair induce the formation of population gratings in both the ground and excited state of the storage material whose relative amplitude and spatial phase as a function of frequency represent the temporal structure of the writing pulse. If the population of storage material atoms or molecules relaxes in such a way that a portion of this information remains in the ground state population, the material retains this information as memory. As discussed in more detail above, one method for preserving this distribution in the ground state population for periods of time greater than a few seconds or minutes comprises removing the excited state population via a chemical transformation to an altered ground state population which does not have an absorption transition at $f_a$.

Before examining the sequence in which the material is exposed to the pulses, or the retrieval of stored data, the structure and intensity of the writing and fixing pulses will be discussed.

The writing pulse exists for a time interval, $t_w$, less than or equal to $T_2$, and each data bit within the writing pulse exists for a time interval of $\tau_B$, which is less than $t_w$ (if more than one bit is being written) and greater than or about equal to $T^*_2$. The writing pulse frequency is centered about $f_0$, the central absorption frequency of the storage material, and has a bandwidth $1/\tau_c$. Assuming that the writing pulse is amplitude modulated so as to write a series of binary "0"s and "1"s described above, and assuming $t_w'$ refers to the total interval within $t_w$ during which the writing laser is actually illuminating the sample, then $$\theta_w(f) = \sqrt{t_w'/\tau_c} \cdot 2p/\hbar \cdot E_w(f).$$

If the "on" amplitude of the writing pulse electric field is written $E^\circ_w$, we can write $$\theta_w(f) = \sqrt{t_w'/\tau_c} \cdot 2p/\hbar \cdot E^\circ_w \tau_c.$$

Since $\theta_w(f) \leq 1$, then $$E^\circ_w \leq \hbar/\tau_c 2p \cdot \sqrt{\tau_c/t_w'}.$$

The square root from the above expression is derived by viewing the writing pulse as a number of incoherent subpulses each of duration $\tau_c$ which gives rise to a "random-walk-type" of growth of $\theta_w(f)$. The expression $(t_w'/\tau_c)$ represents the number of "steps". It follows from the above that the intensity of the maximum writing pulse is, $$I_w^{max} \leq \frac{c\pi\hbar}{6\tau_c A \lambda^3 t_w'} \left( \frac{erg}{cm^2 - sec} \right)$$

where $$A = 64\pi^4 p^2/3\hbar\lambda^3,$$

and is the Einstein coefficient for the particular absorption transition. The minimum intensity of the writing pulse is related to the efficiency of detection and has been discussed in detail in the above example.

The fixing pulse exists for a time interval, $t_f$, which is less than or equal to $\tau_c$. The spectral components of this pulse are uniform in amplitude and phase throughout the region wherein the writing pulse has appreciable spectral components. Assuming that the fixing pulse is a temporally square pulse of duration $\tau_c$, we can write $$E_f(f) = E_f(t)\tau_c.$$

As will be discussed below, $\theta_f$ is optimally $\pi/2$, so that the following relationship results:

$$E_f(t) = \frac{\pi\hbar}{4p\tau_c} \text{ or, } I_f = \frac{c\pi^3 \hbar}{24A\tau_c^2\lambda^3} \left( \frac{ergs}{cm^2 - sec} \right) \approx \frac{2t_w'}{\tau_c} I_x^{max}.$$

This expression shows that the number of photons in the maximum intensity writing pulse is roughly equal to the number in the optimum fixing pulses, where N (the number of photons) is $$N = I_f\tau_c s\lambda/hc = \pi^3 s/24A\lambda^2\tau_c$$

which is approximately equal to the number of absorbing atoms illuminated by the pulses (in cross section s and frequency interval $1/\tau_c$) if the sample is one absorption length thick.

INFORMATION RETRIEVAL

The material containing the stored data is exposed to the reading pulse, thereby inducing a free-induction decay signal arising from the term $\rho_{gg}^{(12)}$ of Formula II. This signal is separated from the free decay resulting from the power spectra terms $\rho_{gg}^{(1)}$ and $\rho_{gg}^{(2)}$ by means of positioning a signal detector in the path of the $\rho_{gg}^{(12)}$ free-decay signal propagation, which direction of propagation is different from the power spectra terms and which is discussed in more detail below.

The free-induction decay signal arising from the $\rho_{gg}^{(12)}$ term is described by Formula VI.

$$E_{fd}(t) \alpha \int_{-\infty}^{\infty} g(f_a) \frac{\sin\theta_r(f_a)}{|E_r(f_a)|} E_r(f_a)\rho_{gg}^{(12)}(f_a)e^{i2\pi f_a t}df_a. \quad \text{VI}$$

Wherein g(f) represents the initial distribution of atoms in the ground state (before storage of data) as a function of absorption frequency, and $\theta_r(f)$ is the area of the reading pulse. As mentioned above, $\theta_w(f) \leq 1$, for all frequencies, and the fixing and reading pulses are of a duration sufficiently short to provide uniform spectral components over the region where $\theta_2(f)$ is appreciable. Additionally, over the spectral region in which $\theta_w(f)$ is appreciable, g(f) is essentially constant and close to its maximum value. Taking these conditions into consideration leads one to the conclusion that if the writing pulse occurs first, then the electrical field resulting from stimulating the storage material with a reading pulse is described by Formula VII.

$$E_{FD}(t)\alpha E_w\{-[t-n/c \; \hat{k}_{FD}\cdot\vec{r}] + (t_f + t_r - t_w)\}, \quad \text{VII}$$

$$\text{where } \hat{k}_{FD}(\vec{r}) = \hat{k}_f(\vec{r}) + \hat{k}_r(\vec{r}) - \hat{k}_w(\vec{r}), \text{ and} \quad \text{VIIa}$$

assuming the the fixing and reading pulses are plane waves, and satisfy the condition $$|\vec{k}_r| = |\vec{k}_f + \vec{k}_r - \vec{k}_w|.$$

this assumption guarantees that the atoms throughout the sample will emit coherently, thus maximizing the free-decay signal of $\rho_{gg}^{(12)}$. In the time domain, $E_{FD}(t)$ is a time reverse replica of the writing pulse and the signal propagates along the vector direction, $\hat{k}_{FD}(\vec{r})$.

If the writing pulse occurs second, then the Formula VIII describes the free-induction decay signal.

$$E_{FD}(t)\alpha E_w\{[t-n/c \; \hat{k}_{FD}\cdot\vec{r}] - (t_w + t_r - t_f)\}. \quad \text{VIII}$$

In this case, the free-decay signal, $E_{FD}(t)$, is an exact temporal replica of the writing pulse.

If the storage material is approximately one optical absorption length thick, it can be shown that the intensity of the free-decay signal is described by Formula IX.

$$I_{FD} \simeq (1/200)[\sin^2 \theta_f \sin^2 \theta_r]I_w, \quad \text{IX}$$

where $I_{FD}$ and $I_W$ are the intensities of the free-decay signal and the writing pulse, respectively, at corresponding points on their respective temporal waveforms. The relationship of Formula IX shows that the free-decay signal intensity is optimized when $\theta_f = \theta_r = \pi/2$.

I claim:
1. A method of storing data comprising the steps of:

providing a material having a populated ground state and an excited state, which exhibits inhomogeneous absorption linewidth broadening about an absorption transition, characterized by homogeneous absorption frequencies of homogeneous bandwidth within an inhomogeneous absorption bandwidth, and by a homogeneous and an inhomogeneous dephasing time, each of said dephasing times being about equal to the inverse of said homogeneous and said inhomogeneous bandwidth, respectively, and which material undergoes transitions from the ground state to the excited state upon exposure to electromagnetic radiation within the ultraviolet, visible or infrared region and having spectral components within said inhomogeneous absorption bandwidth;

exposing said material to an information-containing writing pulse comprising a modulated pulse of said electromagnetic radiation, consisting essentially of spectral components within said inhomogeneous absorption bandwidth;

exposing said material to a fixing pulse of said electromagnetic radiation consisting essentially of spectral components having uniform amplitude and phase throughout the spectrum of said writing pulse;

wherein said material is exposed to said writing pulse and said fixing pulse within a period of time less than or about the homogeneous dephasing time of said absorption transition within said material, and wherein the intensity of each said pulse is not greater than required to cause about one half of the ground state population of said material to make a transition from said ground state to said excited state of said material; thereby resulting in the storage in said material of said writing pulse information.

2. A method of storing data comprising the steps of:
providing a material having a populated ground state and an excited state and exhibiting inhomogeneous absorption line broadening about a first absorption transition, $f_0$, having an inhomogeneous bandwidth of $\Delta f_{0I}$, and an inhomogeneous dephasing time about equal to $1/\Delta f_{0I} = T^*_2$, and a homogeneous dephasing time equal to about $1/\Delta f_{0H} = T_2$, where $\Delta f_{0H}$ is the homogeneous absorption bandwidth within said inhomogeneous bandwidth, and about a correlative absorption transition, $f_1$, having an inhomogeneous bandwidth of $\Delta f_{1I}$, and which material upon exposure to electromagnetic radiation within the ultraviolet, visible or infrared region and of frequency $f_0 \pm \Delta f_{0I}/2$ or $f_1 \pm \Delta f_{1I}/2$, undergoes absorption transitions from said ground state to said excited state;

exposing said material to a writing pulse of electromagnetic radiation of frequency about $f_0$, and having a spectral width, $\Delta f_W$, narrower than $\Delta f_{0I}$, said writing pulse being amplitude or frequency modulated in an information-containing way;

said writing pulse existing for a period of time greater than about the inhomogeneous dephasing time of said first absorption transition, $T^*_2$, and less than or about the homogeneous dephasing time of said first absorption transition, $T_2$;

exposing said material to a fixing pulse of electromagnetic radiation having uniform spectral components throughout the spectrum of said writing pulse and existing for a period of time equal to about $1/\Delta f_W$;

wherein said material is exposed to said pulses within a time interval less than or equal to about $T_2$;

wherein the intensity of each said pulse is not greater than required to cause about one half of the ground state population of said material to make a transition from said ground state to said excited state of said material;

thereby resulting in the storage of the information contained in said writing pulse separately and independently in both said ground state and said excited state of said material.

3. A method of storing said retrieving data comprising the steps of:
storing data according to claim 2;
exposing said material to a reading pulse comprising electromagnetic radiation consisting essentially of spectral components having uniform amplitude and phase either throughout the spectrum of said writing pulse or throughout the correlative spectrum centered about frequency $f_1$;
said reading pulse having an intensity sufficient to transfer about one half of the information-containing population of said material from one state to another state;
thereby inducing said material to emit a free-induction decay signal;
receiving and detecting said free-induction decay signal, thereby retrieving the information contained in said writing pulse.

4. A method of storing a series of data bits, according to the method of claim 2, further comprising:
providing a matrix of n discrete storage cells, wherein each said cell comprised of said material exhibits inhomogeneous absorption line broadening about frequencies $f_0$ and $f_1$;
providing a series of n discrete pairs of writing and fixing pulses, each of said pairs of pulses containing m data bits;
exposing each of n successive cells in said matrix to a corresponding series of n successive pairs of information-containing writing and fixing pulses, thereby resulting in the storing of a series of n x m data bits in said matrix.

5. A method according to claim 4, further comprising the steps of:
exposing each of n discrete cells to a discrete reading pulse;
said reading pulse comprising electromagnetic radiation consisting essentially of spectral components having uniform amplitude and phase either throughout the spectrum of said writing pulse or throughout the correlative spectrum centered about $f_1$;
said reading pulse having an intensity not greater than required to transfer about one half of the information-containing population of said material from one state to another state;
thereby inducing each said cell in said matrix to emit a free-induction decay signal; and,
detecting and receiving said free-induction decay signals from said cells, thereby retrieving n x m data bits.

6. A method according to claim 3 or 5 further comprising:
said reading pulse propagating in vector direction $\vec{k}_r$;
said writing pulse propagating in vector direction $\vec{k}_w$;
said fixing pulse propagating in vector direction $\vec{k}_f$;

said writing pulse following said fixing pulse in time, thereby resulting in the time-accurate storage of information contained in said writing pulse; and, said free-induction decay signal propagating in the vector direction $\vec{k}_d$;

wherein $\vec{k}_d = \vec{k}_r + \vec{k}_w - \vec{k}_f$, provided that $|\vec{k}_r| = |\vec{k}_r + \vec{k}_w - \vec{k}_f|$.

7. A method according to claim 3 or 5 further comprising:

said reading pulse propagating in vector direction $\vec{k}_r$;

said writing pulse propagating in vector direction $\vec{k}_w$;

said fixing pulse propagating in vector direction $\vec{k}_f$;

said writing pulse preceding said fixing pulse in time, thereby resulting in the time-reversed storage of information contained in said writing pulse; and, said free-induction decay signal propagating in the vector direction $\vec{k}_d$;

wherein $\vec{k}_d = \vec{k}_r - \vec{k}_w + \vec{k}_f$, provided that $|\vec{k}_r| = |\vec{k}_r - \vec{k}_w + \vec{k}_f|$.

8. A method according to claim 1, 2, 3, 4, or 5 wherein said material undergoes a photochemical reaction upon exposure to said writing and said fixing pulses.

9. A method according to claim 8 wherein said reading pulse comprises electromagnetic radiation having uniform spectral components over the information containing portion of said second inhomogeneously broadened absorption transition.

10. A data storage system comprising:

a storage material which exhibits inhomogeneous absorption line broadening about frequency, $f_0$, having an inhomogeneous bandwidth, $\Delta f_I$, a homogeneous bandwidth of $\Delta f_H$ and a homogeneous dephasing time of $1/\Delta f_H$;

a means of generating a data input signal;

a means for segmenting said data input signal into discrete information-containing signals;

a laser means tuned to a frequency of about $f_0$ having a bandwidth of $\Delta f_W$ less than $\Delta f_I$;

a means for modulating said laser means according to said information-containing signals, thereby resulting in a writing pulse;

a means for modulating said laser means to provide a fixing pulse of duration about $1/\Delta f_W$;

a first timing means for sequentially relating said writing pulse to said fixing pulse;

a means for orienting the direction of propagation of said pulses through said material; and a second timing means providing for the sequential excitation of said material by said writing and fixing pulses within a discrete time interval of less than or about equal to the homogeneous dephasing time, $1/\Delta f_H$ of said material.

11. A data storage system comprising:

a material exhibiting inhomogeneous absorption line broadening about frequencies $f_0, f_1, f_2 \ldots f_n$ and of corresponding inhomogeneous bandwidths $\Delta f_{0I}, \Delta f_{1I}, \Delta f_{2I} \ldots \Delta f_{nI}$, homogeneous bandwidths $\Delta f_{0H}, \Delta f_{1H}, \Delta f_{2H}, \Delta f_{nH}$, within said respective inhomogeneous bandwidths, and homogeneous dephasing times, $T_2(0), T_2(1), T_2(2) \ldots T_2(n)$, about equal to the inverse of said respective homogeneous bandwidths and having the characteristic of undergoing electromagnetically induced transitions from the ground state of said material to an excited state of said material upon exposure to electromagnetic field pulses within the ultraviolet, visible or infrared regions and of frequencies about $f_0, f_1, f_2 \ldots f_n$, respectively, of bandwidth $\Delta f_0, \Delta f_1, \Delta f_2 \ldots f_n$, and of duration less than or about equal to the homogeneous dephasing time of $T_2(0), T_2(1), T_2(2) \ldots T_2(n)$, respectively, and which material is capable of producing a free induction decay emission subsequent to undergoing said transitions from the ground state to the excited state of said material;

a means of generating a data input signal;

a means for segmenting said data signal into discrete information-containing signals;

laser means for producing a first beam of frequency about $f_0$, and of bandwidth $\Delta f_0$ less than said inhomogeneous bandwidth $\Delta f_{0I}$, spanning a time interval of less than about $T_2(0)$;

means for modulating said first beam according to said discrete information-containing signals, thereby resulting in a writing pulse, which propagates in vector direction $\vec{k}_w$;

means for exposing said material to said writing pulse comprising controlling $\vec{k}_w$;

said laser means further comprising means for producing a fixing pulse of frequency about $f_0$ and of duration of about $1/\Delta f_0$ and which propagates in vector direction $\vec{k}_f$;

means for exposing said material to said fixing pulse comprising controlling $\vec{k}_f$;

timing means for producing a time dependent relationship between said writing pulse and said fixing pulse resulting in the time interval in which said material is exposed to one said writing pulse and one said fixing pulse being less than or about equal to $T_2(0)$;

said laser means further comprising means for producing a reading pulse, which propagates in vector direction $\vec{k}_r$, of frequency $f_0$ or at a correlative absorption frequency about $f_1$, about $f_2 \ldots$ or about $f_n$, providing uniform spectral excitation of information stored by said writing and fixing pulses thereby inducing said material to emit a free-induction decay signal which propagates in vector direction $\vec{k}_d$;

means for exposing said material to said reading pulse comprising controlling $\vec{k}_r$;

means for detecting and receiving said free-induction decay signal.

12. A data system according to claim 11 wherein:

said timing means provides for said writing pulse to precede said fixing pulse;

all three said directional vector exposing means provide for $|\vec{k}_r| = |\vec{k}_r + \vec{k}_f - \vec{k}_w|$; and said detecting means is positioned in the propagation path of $\vec{k}_d$, wherein $\vec{k}_d = \vec{k}_r + \vec{k}_f - \vec{k}_w$.

13. A data system according to claim 11 wherein:

said timing means provides for said writing pulse to follow said fixing pulse;

all three said directional vector exposing means provide for $|\vec{k}_r| = |\vec{k}_r - \vec{k}_f + \vec{k}_w|$; and said detecting means is positioned in the propagation path of $\vec{k}_d$, wherein $\vec{k}_d = \vec{k}_r - \vec{k}_f + \vec{k}_w$.

* * * * *